United States Patent
Liu et al.

(10) Patent No.: US 9,089,800 B2
(45) Date of Patent: Jul. 28, 2015

(54) METHOD AND APPARATUS FOR VAPOR AND GAS FILTRATION

(75) Inventors: Benjamin Y.H. Liu, North Oaks, MN (US); Yamin Ma, Roseville, MN (US); Thuc M. Dinh, Shakopee, MN (US)

(73) Assignee: MSP Corporation, Shoreview, MN (US)

( * ) Notice: Subject to any disclaimer, the term of this patent is extended or adjusted under 35 U.S.C. 154(b) by 196 days.

(21) Appl. No.: 13/570,364

(22) Filed: Aug. 9, 2012

(65) Prior Publication Data

US 2013/0203264 A1    Aug. 8, 2013

Related U.S. Application Data

(60) Provisional application No. 61/594,694, filed on Feb. 3, 2012, provisional application No. 61/620,667, filed on Apr. 5, 2012.

(51) Int. Cl.
| | |
|---|---|
| *B01D 46/00* | (2006.01) |
| *B01D 39/20* | (2006.01) |
| *B01D 46/24* | (2006.01) |
| *C23C 16/448* | (2006.01) |

(52) U.S. Cl.
CPC ........ *B01D 39/2044* (2013.01); *B01D 46/0021* (2013.01); *B01D 46/2403* (2013.01); *C23C 16/448* (2013.01)

(58) Field of Classification Search
USPC ............... 55/522–524, 485; 95/273; 118/715; 210/493.2, 496; 219/85.13; 228/115, 228/228
See application file for complete search history.

(56) References Cited

U.S. PATENT DOCUMENTS

| | | | | |
|---|---|---|---|---|
| 3,433,632 A | * | 3/1969 | Elbert et al. | 419/2 |
| 3,677,721 A | * | 7/1972 | Elbert et al. | 138/145 |
| 4,179,274 A | * | 12/1979 | Moon | 55/524 |
| 4,750,409 A | * | 6/1988 | Hendry | 92/158 |
| 5,171,341 A | * | 12/1992 | Merry | 55/484 |

(Continued)

FOREIGN PATENT DOCUMENTS

| | | |
|---|---|---|
| JP | 2008-534279 A | 8/2008 |
| KR | 1020090125014 A | 12/2009 |
| KR | 10-2010-0103462 A | 9/2010 |

OTHER PUBLICATIONS

Office Action for Korean Patent Application No. 10-2013-0012148, mailed Sep. 26, 2014.

(Continued)

*Primary Examiner* — Duane Smith
*Assistant Examiner* — Minh-Chau Pham
(74) *Attorney, Agent, or Firm* — Westman, Champlin & Koehler, P.A.; Z. Peter Sawicki

(57) ABSTRACT

A gas filtration apparatus and method comprises a housing with an inlet for gas to enter and an outlet for the gas to exit. The housing contains a filter comprised of sintered metal fibers having an active filtration area through which the gas flows to remove suspended particles from the gas. The filter is substantially uniform in thickness and porosity through the active filtration area. The filter media being sealed to a metal structure in the housing with the metal structure having an opening to permit gas to flow through. A method of making a vapor/gas mixture includes the steps of producing a vapor in a gas to form the vapor/gas mixture passing the vapor/gas mixture through an opening in a housing containing a filter comprised of sintered metal fibers through which the vapor/gas mixture flows.

20 Claims, 8 Drawing Sheets

(56) References Cited

U.S. PATENT DOCUMENTS

| | | | |
|---|---|---|---|
| 5,204,067 A * | 4/1993 | Haerle | 422/177 |
| 5,283,106 A * | 2/1994 | Seiler et al. | 428/198 |
| 5,308,370 A * | 5/1994 | Kraft et al. | 55/487 |
| 5,380,580 A * | 1/1995 | Rogers et al. | 428/219 |
| 5,458,664 A * | 10/1995 | Ishii et al. | 55/282 |
| 5,486,220 A * | 1/1996 | Honda et al. | 55/487 |
| 5,545,242 A * | 8/1996 | Whitlock et al. | 55/502 |
| 5,626,651 A * | 5/1997 | Dullien | 95/214 |
| 5,803,991 A * | 9/1998 | Tsubouchi et al. | 148/280 |
| 5,917,066 A * | 6/1999 | Eisenmann et al. | 55/502 |
| 5,937,263 A * | 8/1999 | Eisenmann et al. | 419/2 |
| 6,080,219 A * | 6/2000 | Jha et al. | 55/486 |
| 6,329,625 B1 * | 12/2001 | Quick et al. | 219/85.13 |
| 8,097,071 B2 * | 1/2012 | Burgess et al. | 95/273 |
| 2009/0084315 A1 | 4/2009 | Liu et al. | |
| 2009/0165651 A1 | 7/2009 | Burgess et al. | |
| 2010/0098968 A1 * | 4/2010 | Rabiei | 428/613 |
| 2011/0006015 A1 * | 1/2011 | Leonard et al. | 210/767 |
| 2013/0316072 A1 * | 11/2013 | Scordilis-Kelley et al. | 427/58 |
| 2014/0091241 A1 * | 4/2014 | Rabiei | 250/518.1 |

OTHER PUBLICATIONS

Office Action for Korean Patent Application No. 101-2013-0012148, dated Feb. 25, 2015.

* cited by examiner

METHOD AND APPARATUS FOR VAPOR AND GAS FILTRATION

CROSS-REFERENCE TO RELATED APPLICATION

The present application is based on and claims the benefit of U.S. provisional patent application Ser. No. 61/620,667 filed Apr. 5, 2012 and U.S. provisional patent application Ser. No. 61/594,694 filed Feb. 3, 2012, the contents of which are hereby incorporated by reference in their entirety.

BACKGROUND OF THE DISCLOSURE

Thin film deposition for semiconductor device fabrication is usually carried out through a gas phase process, such as chemical vapor deposition (CVD), plasma-enhanced chemical vapor deposition (PECVD) or atomic layer deposition (ALD). In such a process a chemical precursor in liquid form is first vaporized to generate vapor with a carrier gas to form a vapor/gas mixture, which then flows into a deposition chamber to create a thin film on a substrate.

The vapor generating device is usually made of metal and held at an elevated temperature to generate vapor with the desired vapor pressure for the process. At a sufficiently high temperature, the metal surface in contact with the precursor will cause it to thermally decompose forming undesirable by-products and particulate contaminants suspended in the vapor/gas mixture. When the mixture flows into the deposition chamber to form thin films on a substrate, the contaminant particles will deposit on the substrate to form defective films. To reduce particulate contamination a filter can be placed in the vapor/gas stream to remove suspended particles prior to its entry into the deposition chamber.

SUMMARY OF THE DISCLOSURE

A gas filtration apparatus comprises a housing with an inlet for gas to enter and an outlet for the gas to exit. The housing contains a filter comprised of sintered metal fiber filter media having an active filtration area through which the gas flows to remove suspended particles from the gas. The filter media being substantially uniform in thickness and porosity through the active filtration area. The filter media being sealed to a metal structure in the housing with the metal structure having an opening to permit gas to flow through.

A method of making a vapor/gas mixture includes the steps of producing a vapor in a gas to form the vapor/gas mixture passing the vapor/gas mixture through an opening in a housing containing a filter comprised of sintered metal fibers through which the vapor/gas mixture flows. The filter being substantially uniform in thickness and porosity through an active filtration area, the filtration area being sufficient to produce a pressure drop of approximately 0.4 kPa or less when nitrogen gas flows through the filtration area at a temperature in a range of approximately 20-25° C. with an absolute pressure in the range of approximately 98-102 kPa, the gas being at a flow rate of approximately 3 standard liters per minute to remove suspended particles from the vapor/gas mixture.

DESCRIPTION OF THE EXEMPLARY EMBODIMENTS

The present disclosure describes a method and an apparatus for removing suspended particles from a heated vapor/gas mixture for thin film deposition on a substrate. The method and apparatus are particularly useful for thin film deposition in semiconductor, integrated circuit device manufacturing. The method and apparatus can also be used in non-semiconductor applications as well, such as reducing defects in optical coatings, including anti-reflective coatings used in photovoltaic cells for solar energy conversion and other applications.

Figure 1:
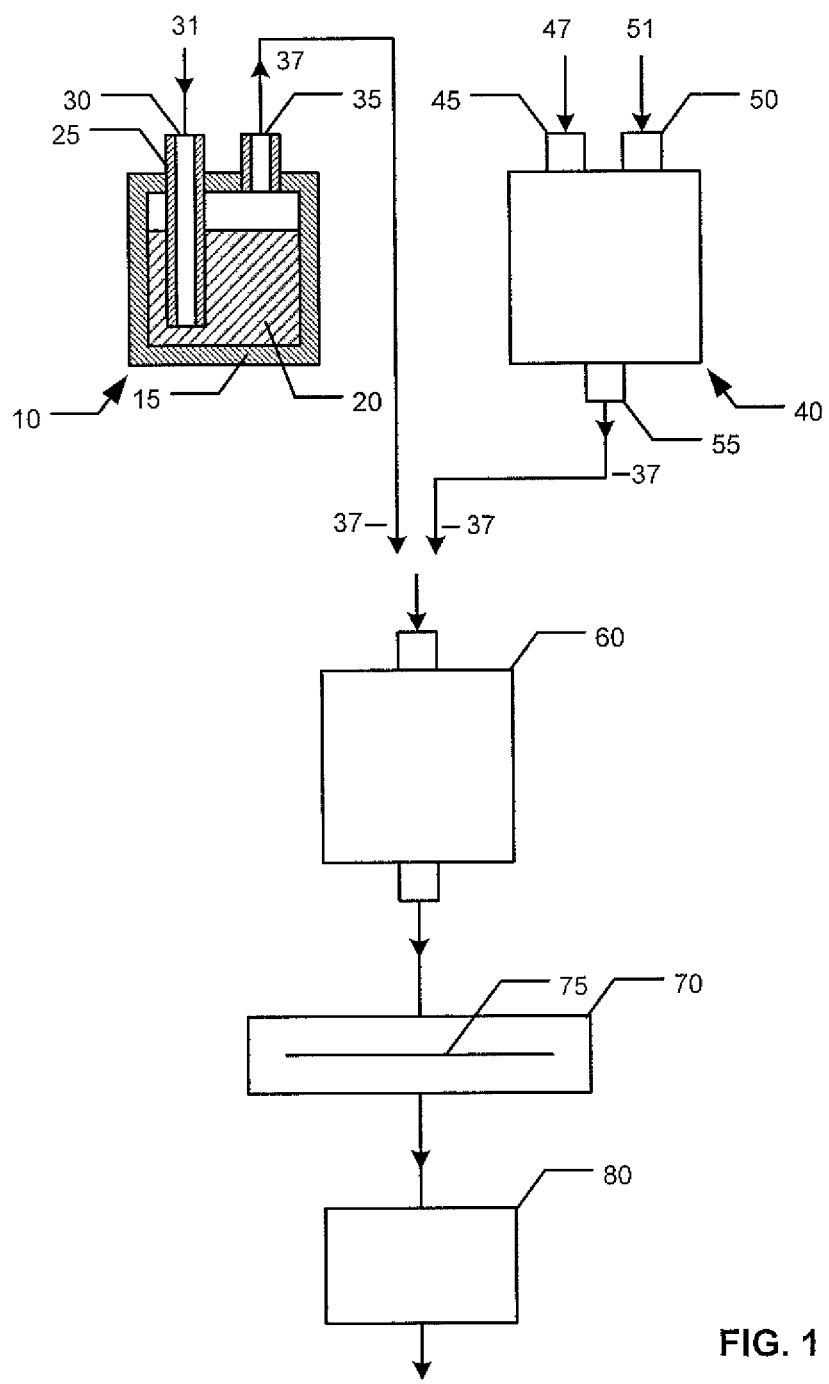
FIG. 1 is a schematic diagram of a system for thin film deposition on a substrate using a filtration apparatus to reduce particulate contaminations in the vapor/gas mixture.

FIG. 1 is a schematic diagram of a system using a vapor generating apparatus to create vapor from a precursor chemical in liquid form for thin film deposition on a substrate. Like reference characters will be used for like elements throughout the figures. The substrate is typically a silicon wafer on which integrated circuit devices are fabricated. Either a bubbler, shown located at 10 or a direct liquid injection vaporizer located at 40 can be used to form a vapor/gas mixture. The mixture, from either the bubbler or the vaporizer, then flows through a filter, 60, to remove suspended particles generated by either of the two vapor generating apparatuses. The vapor/gas mixture then flows through a deposition chamber 70 containing a substrate 75 to create a thin film on the substrate. The substrate is typically a silicon wafer, but other substrates such as glass, metal, polymer, or ceramic can also be used. The substrate can also carry a conducting, insulating, or a semiconducting surface layer on which additional film layers are to be deposited.

A vacuum pump 80 is generally provided to maintain the system at a desired operating pressure for thin film deposition on the substrate. Other system components, such as electric heaters; temperature, pressure, gas and liquid flow sensors and controllers, which are usually part of such a system are not shown for simplicity.

In FIG. 1, bubbler 10 is comprised of a metal vessel 15 containing a precursor liquid 20, a tube 25 with an inlet 30 for a carrier gas 31 to flow through to form bubbles in the liquid 20 causing the vapor from the liquid to diffuse into the carrier gas to form a vapor/gas mixture 37. The mixture 37 then flows out of the bubbler through outlet 35. Metal vessel 15 is typically made of stainless steel and held at an elevated temperature to cause liquid 20 to vaporize and form vapor at a desired vapor pressure. Heating is usually accomplished with an electrical heater, which is not shown, and a temperature controller, also not shown, so that the bubbler vessel 15 together with the liquid precursor liquid 20 contained therein will be heated to a desired operating temperature to form vapor with the desired vapor pressure. Common carrier gas includes nitrogen, argon, and helium, among others.

In the case of a direct liquid injection vaporizer, shown generally at 40, the vaporizer is provided with a gas inlet 45 for a carrier gas 47 to enter, and an inlet 50 for a precursor liquid 51 to enter. The rates of gas and liquid flow into the vaporizer are controlled by a gas flow controller and a liquid flow controller, which are not shown for simplicity. The vaporizer is generally constructed of stainless steel and is provided with an electrical heater, which is not shown, and a temperature controller, also not shown to maintain the vaporizer at a desired temperature. As the gas and liquid flow through internal flow passageways in the vaporizer, which are not shown, heat is transferred to the flowing gas and liquid streams causing the liquid to vaporize fowling the vapor/gas mixture 37 at a desired temperature. The mixture 37 then flows out of outlet 55 for thin film deposition on the substrate 75.

The vapor/gas mixture from either the bubbler at 10 or the direct liquid injection vaporizer at 40 then flows through filter 60 to remove suspended particles. The mixture then flows into the deposition chamber 70 for thin film deposition on the substrate 75 contained therein as shown in FIG. 1. The pump, 80, is typically provided to exhaust the vapor/gas mixture to the ambient.

Filtration apparatus for semiconductor integrated circuit device fabrication typically includes a metal housing and a metal porous filter media. The metal is typically stainless steel. The metal porous filter media can be a sintered powder metal media, or a sintered metal fiber media. In the former case, the powder metal would be formed into the desired shape and held under pressure at a suitably high temperature to cause the powder particles to "sinter" forming strong bonds between the metal powder particles. Methods for making sintered powder metal objects including sintered stainless steel porous metal, are well known to those skilled in the art of making sintered powder metals. Sintered powder metals are generally made in the form of a sheet, a rod, a tube, or a cup, which can then be welded to solid metal parts to form a filter for the desired application. An example of such a filter for thin film deposition applications is found in Patent Publication US2009/0084315 A1 herein incorporated by reference in its entirety.

Metal fiber filters have also been used for vapor and gas filtration. Patent Publication US2009/0165651A1 describes a cylindrically shaped sintered fiber filter with a non uniform density varying from a center portion toward an end portion to create a filter element having a high efficiency for particle removal at a specific flow rate per unit area of gas flow. The filter efficiency for particle removal is greater than 99.999% corresponding to a five log reduction in particle concentration at the most penetrating particle size. U.S. Pat. No. 7,045,219 describes the manufacturing and use of sintered metal filter products for a variety of different industrial applications. Both U.S. Patent Publication US2009/0165651 and U.S. Pat. No. 7,045,219 are herein incorporated by reference in their entirety.

For thin film deposition on a substrate by the system shown in FIG. 1, the efficiency of the filter must be sufficiently high to reduce particulate contamination to a suitably low level. In addition, its pressure drop must also be sufficiently low so that the conductance of the flow path and conductance of the filter, both of which are inversely proportional to the pressure drop at the desired rate of gas flow, must be sufficiently high to avoid producing excessive flow restriction in the system.

For semiconductor integrated circuit device fabrication, the pressure drop of the filtration apparatus is typically less than 1/0 kPa when a nitrogen gas at approximately 20 to 25° C. temperature range with an absolute pressure in an approximate range of 98 to 100 kPa flows through the filter at approximately 3 standard liters per minute. The particle removal efficiency is typically greater than 90% at an approximate particle size in the 10 to 100 nm diameter range. In some cases, even a lower pressure drop is desired. In which case, a pressure drop would be less than approximately 0.4 kPa when nitrogen gas in approximate 20 to 25° C. temperature range with an absolute pressure range of approximately 98 to 100 kPa flows through the filter at approximately 3 standard liters per minute. Since pressure drop through a porous filter media is generally proportional to the rate of gas flow and the gas viscosity, knowing the pressure drop at one gas flow rate for one gas will allow the pressure drop to be determined over a wide range of gas flow rates for different gases for which the viscosity is known.

In a typical application, in which a semiconductor, integrated circuit device is fabricated with a device geometry of for example, approximately 30 nm, a wafer surface particle count of approximately 10 particles per wafer larger than approximately 30 nm may be considered as acceptable. If the actual particle count is, for example, approximately 100 per wafer without the use of a filter, a filter with a 90% efficiently will suffice to reduce the wafer surface particle count from approximately 100 per wafer, which is unacceptable, to approximately 10 per wafer, which is acceptable.

In semiconductor integrated circuit device manufacture, both the efficiency and the pressure drop are important. If the filter efficiency is higher than necessary but the pressure drop is not low enough to be adequate, the filter is still not acceptable. Both the efficiency and pressure drop must be taken into consideration in filter design so that the overall filtration device is acceptable for a specific application.

Figure 2:
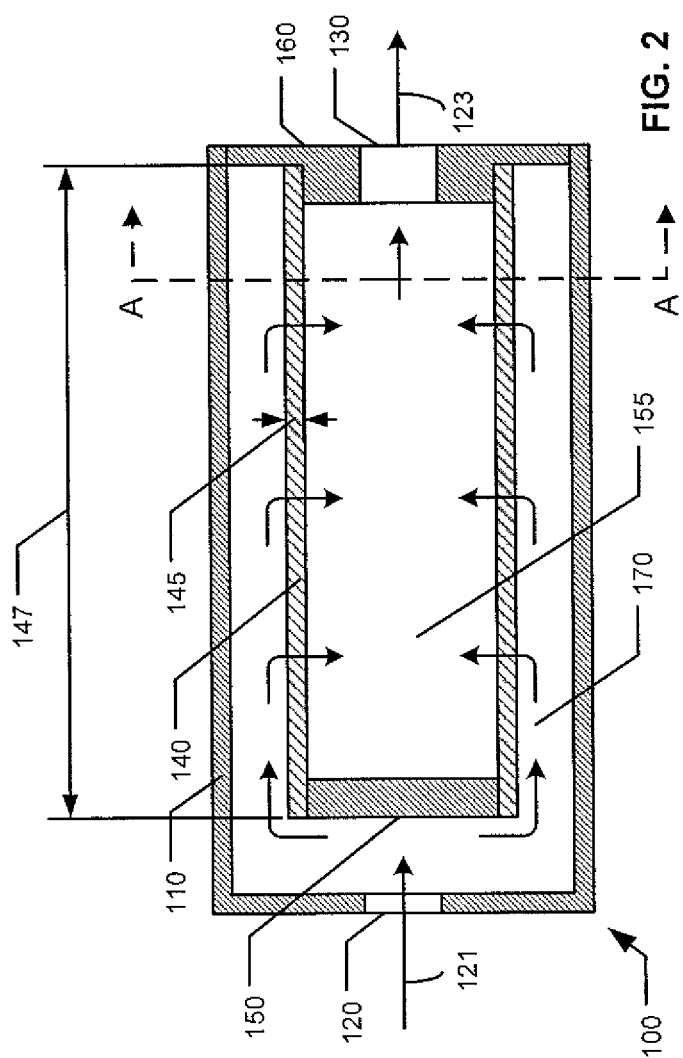
FIG. 2 is a schematic sectional view of a filtration apparatus for removing suspended particles from a vapor/gas mixture.

FIG. 2 shows a schematic diagram of another embodiment of a filtration apparatus of the present disclosure. The apparatus is shown generally located at 100. The apparatus is comprised of a housing 110, with inlet 120 for the gas 121 to enter, and outlet 130, for filtered gas 123 to exit. A tubular shaped filter 140, which is typically made of sintered metal fibers, is attached to two end pieces, a solid metal piece 150 and a metal piece 160 on the other end that has an opening for the gas to flow through. As the gas flows into the filtration apparatus through inlet 120, it flows into the space 170 between housing 110 and tubular filter media 140, then through the porous filter media 140 into the interior space 155 of filter 140. The gas then flows out of filtration apparatus 100 through outlet 130. All parts of apparatus 100 are made of a metal, typically stainless steel, including filter housing 110, tubular filter element 140 and the end pieces, 150 and 160. To prevent leakage, all metal parts that are in contact with each other generally are welded to form a leak-free joint including filter element 140 and end pieces 150 and 160 as well as housing 110 and end piece 160. This applies not only to components and pieces in FIG. 2, but to those components and pieces shown in all figures through-out this disclosure.

Figure 3:
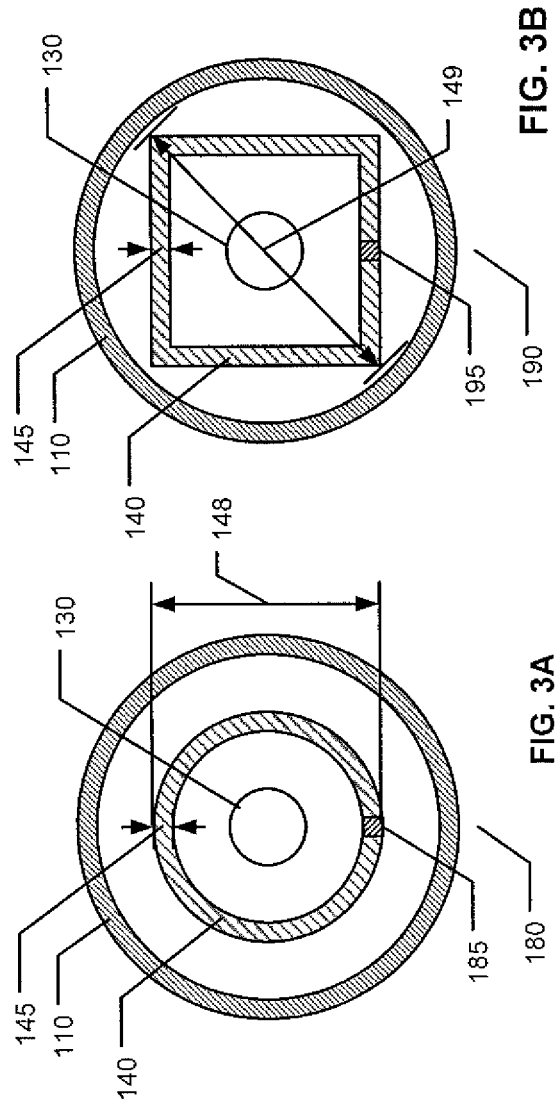
FIGS. 3A and 3B are each sectional views of filtration apparatus taken along the line A-A in of FIG. 2.

Tubular filter element 140 is generally made of sintered metal fibers having a thickness 145 that is substantially uniform and a porosity that is also substantially uniform throughout the active area of the filter for gas filtration. The active area for gas filtration is that area of the filter through which is intended that the vapor/gas mixture flow through at an efficient level with the selected pressure drop. The thickness of the tubular filter element wall is typically less than approximately 2.5 mm and the porosity is typically approximately 85% or less. In addition, the tubular filter element typically has a cross-section shape as shown in FIGS. 3 and 3B. Two cross-sectionaled shapes are shown: a circular shape as shown at 180 in FIG. 3A or a polygonal shape as shown at 190 in FIG. 3B. Possible polygonal shapes include a three-sided polygon, i.e. a triangle, a four-sided polygon, i.e. a rectangle or a square, or a five sided polygon, i.e. a pentagon. Other polygonal shapes in addition to the above can also be used. Housing 110 is shown in FIGS. 3 and 3B as circular. However, like the filter element, housing 110 can also have a polygonal cross-sectional shape, including such shapes as a triangle, a rectangle, a pentagon, and other polygonal shapes that are not shown. The tubular filter element is typically fabricated from a flat sheet of sintered metal filter material and welded along its edges as indicated by seam 185 or 195 as shown in FIGS. 3A and 3B, respectfully. The seam is not an active area for gas filtration. Therefore, its thickness and porosity may both be lower than those in the active area of the filter for gas filtration.

In order to save space, and to save cost, it is desirable that the filter element be made as small as possible, using a minimum amount of filter media suitable for the application. The tubular filter media designed for semiconductor integrated device manufacturing is expected to have a maximum lateral width of approximately 80 mm and a maximum length of approximately 160 mm. In some applications, the diameter or maximum lateral width is approximately 40 mm, and the maximum length is approximately 80 mm. The maximum lateral dimension for a tubular filter with a circular cross section is the outer diameter 148 of the filter as shown in FIG. 3. For a tubular filter having a square shaped cross section the maximum lateral dimension is the width 149 along its diagonal. The longitudinal length of these filters is shown as 147 in FIG. 2.

The efficiency of the filter for particles with a diameter in the approximate range of 10 to 100 nm at normal temperature and pressure conditions is typically higher than approximately 90%. For purpose of this disclosure, filter efficiency refers to measurements made with nitrogen gas in an approximate 20 to 25° C. temperature range and absolute pressure in an approximate 98 to 102 kPa range. As stated earlier, in all cases, the pressure drop of the filter is less than approximately 1.0 kPa and in some cases less than approximately 0.4 kPa.

Figure 4:
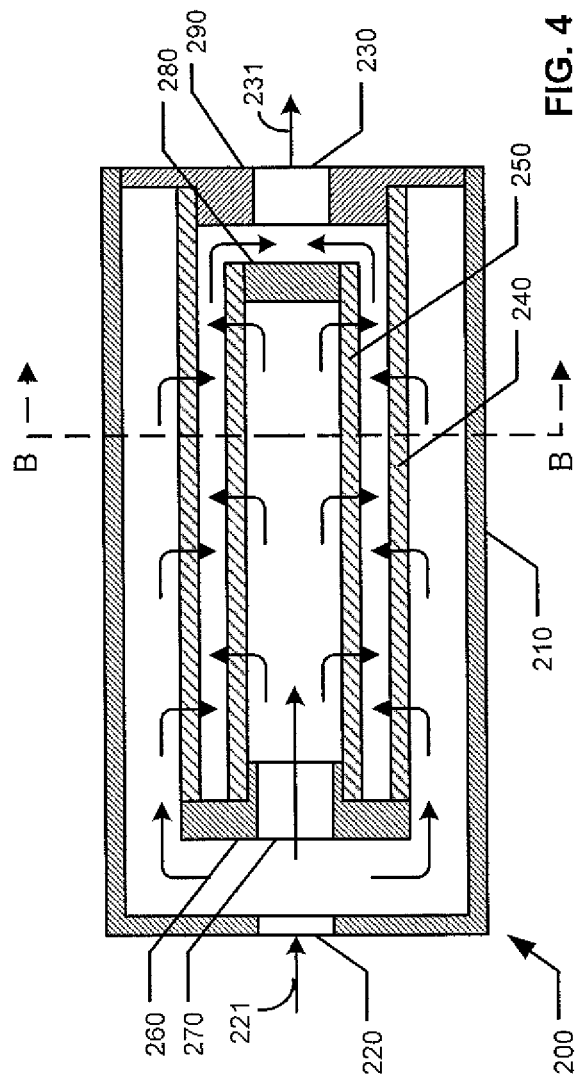
FIG. 4. is a schematic sectional view of yet another filtration apparatus of the present disclosure.
Figure 5:
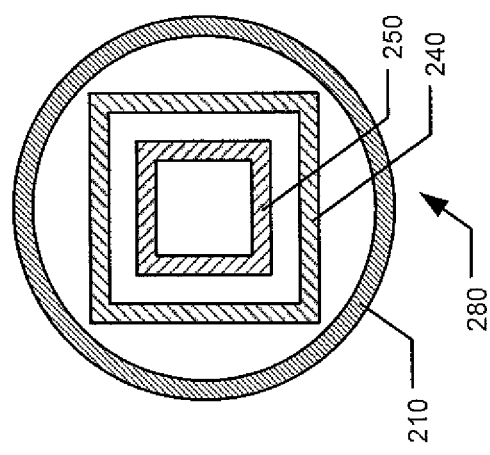
FIGS. 5A and 5B are each sectional views of filtration apparatus taken along the line B-B in of FIG. 4.
Figure 5A:
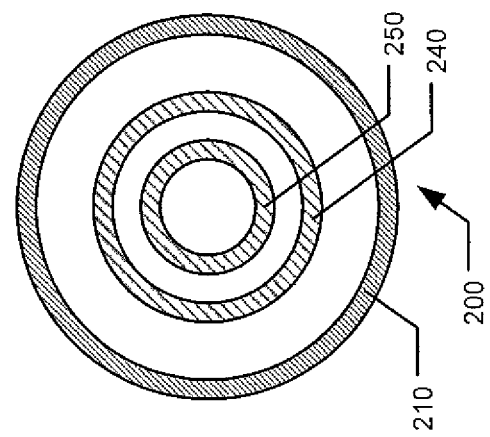

FIG. 4 is a schematic diagram of another filtration apparatus of the present disclosure. The filtration apparatus is shown generally located at 200. Unlike the filtration apparatus of FIG. 2 that has a single cylindrical filter element, the filtration apparatus of FIG. 4 is comprised of two separate filter elements, 240 and 250. Both filter element 240 and filter element 250 are comprised of sintered metal fibers of a substantial uniform thickness and porosity throughout the active area of the filter for gas filtration, and both are tubular in shape, with a cross sectional shape that is either circular or polygonal as shown at 200 and 280 respectively in FIG. 5. A four-sided polygon in the form a square is shown at 280. Other polygonal shapes are also possible and can be used, such as a three-sided polygon, i.e. a triangle, a four-sided polygon, i.e. a rectangle, a five-sided polygon, i.e. a pentagon, among others.

Filtration apparatus 200 of FIG. 4 is provided with a housing 210 with inlet 220 for gas 221 to enter and outlet 230 for filtered gas 231 to exit Filter element 240 is provided with two end pieces. End piece 260 is a solid piece of metal with an opening 270 for the gas to flow through. End piece 290, which is part of housing 210, is also provided with an opening 230 for the gas 231 to exit. Filter element 250 is welded on one end to solid piece 260 with an opening 270 for the gas to flow through and a solid piece 280 on the other end. Gas entering through housing inlet 220 will thus flow through both filter elements as shown by the arrows and exit housing through outlet 230. Again, welding a porous filter media onto a solid metal piece will generally make that portion of the filter media less porous and even non porous. The welded portion of the filter media will thus no longer be porous or at least less porous than the active area of the filter for gas filtration.

Figure 6:
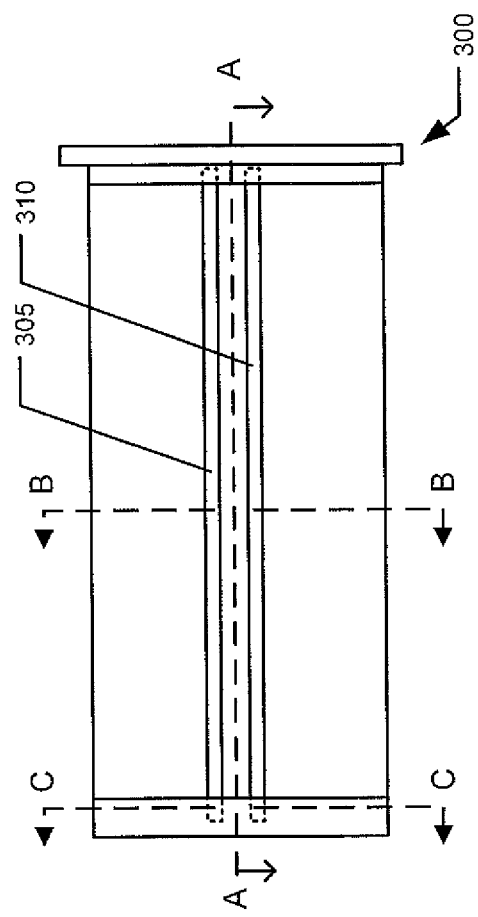
FIG. 6 is a top view of a cylindrical filter fabricated from a flat sheet of sintered fiber filter material.
Figure 7:
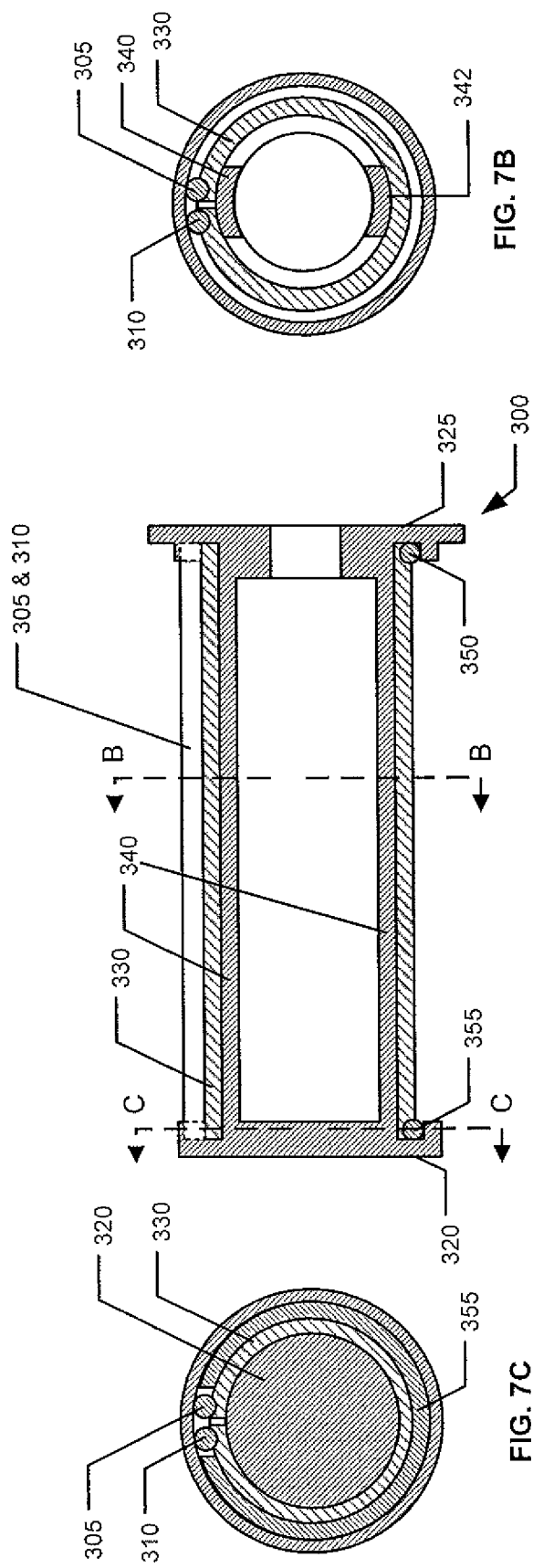
FIGS. 7A, B and C are sectional views taken along the lines A, B and C of FIG. 6.

FIG. 6 is the top view of a cylindrical filter fabricated from a flat sheet of sintered fiber filter material of the present invention. In the conventional method for fabricating such filters, the filter media, i.e. the sintered fiber filter material, is generally welded to a supporting metal structure to form a complete filtration device. In the present invention, the filter is shown generally located at 200. Two metal seal rods 305 and 306 are used to press against the filter media and a metal base lying below to form a compression seal in the longitudinal direction. FIGS. 7A, B and C contains three vertical sectional views showing the detail of the compression seals both in the longitudinal and transverse directions.

In the longitudinal vertical sectional view of FIG. 7A, metal seal rods 305 and 310 are shown held firmly between metal end pieces 320 and 325. In FIG. 7C, these metal seal rods 305 and 310 are shown pressed firmly against the sintered fiber filter media 330, which is supported below by metal end piece 320 lying below. As illustrated in FIG. 7B, metal seal rods 305 and 310 are pressed firmed against sintered fiber filter media 330, which is in turn supported by metal internal support 340 lying below. A second internal support 342 is positioned directly across from support 340. In one embodiment, metal internal supports 340 and 342 extend the length of the filter between end pieces 320 and 325. As best illustrated in FIG. 7B, the supports 340 and 342 extend only in part circumferentially since the sintered metal fiber media 330 needs to be exposed to the gas as discussed subsequently. The internal support 340 prevents the metal seal rods 305 and 301 causing the filter media 330, which is porous, to deform. The local porosity of the filter media below the seal rod will thus decrease, and its flow resistance increase. The net result is decreased gas flow through the seal, and increased particle capture efficiency. It should be noted that for particle capture it is unnecessary to stop the gas flow through the area around the seal completely. By reducing the gas flow and increasing the particle capture efficiency the seal will produce a cleaner gas than the gas flowing through the main body of the sintered fiber filter media. Overall, the particle capture efficiency is not impaired, but improved with the use of the compression seals.

In additional to the metal seal rods for sealing the sintered fiber filter media in the longitudinal direction, a metal seal is provided for each end of the cylindrical filter. The details of the end seals are shown in FIG. 7C. The circular metal seal rod 355 is bent into an incomplete circle and is designed to form a tight seal around sintered fiber filter media 330 by causing the sintered fiber filter to deform to form an effective seal for particle filtration in a manner similar to that described earlier for the longitudinal seal rods. This discussion, therefore, will not be repeated.

Figure 8:
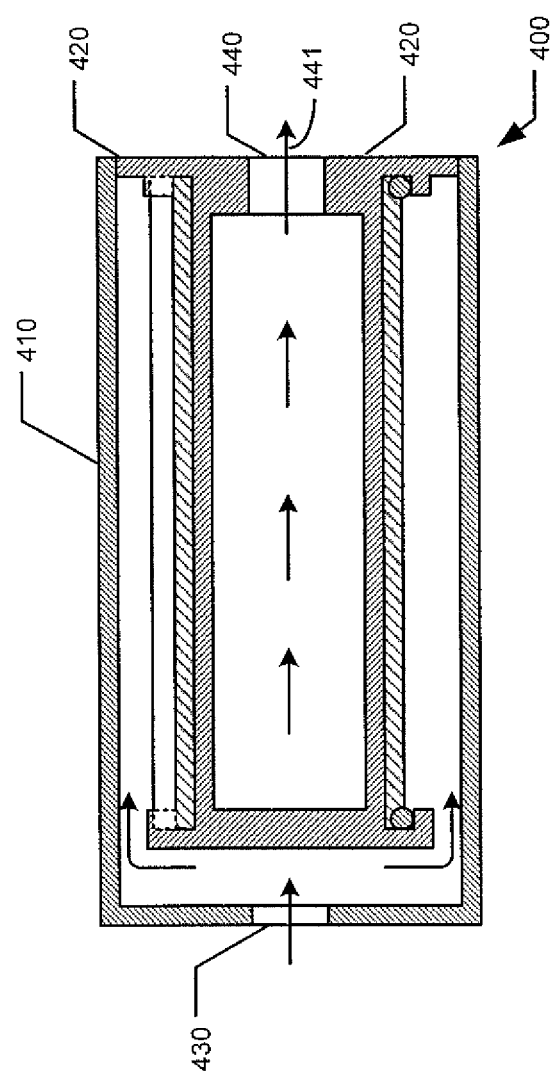
FIG. 8 is a sectional view illustrating the cylindrical filter of FIG. 6 assembled into a filter housing to form a filtration apparatus for gas and vapor filtration.

FIG. 8 shows a gas and vapor particle filtration apparatus, shown generally at 400. The device is fabricated by inserting the cylindrical sintered fiber filter 420 into a metal housing piece 410 and welding the two pieces together at 420 to form a vacuum tight filtration apparatus. The apparatus is provided with an inlet 430 through which the gas and vapor enter and an outlet 440 for the filtered gas and vapor 441 to exit.

While the present invention is directed towards a filtration apparatus for gas and vapor filtration, it is clear to those skilled in the art of gas and vapor filtration design, the device is also effective for the filtration of gas or vapor alone, in addition to the filtration of a gas/and vapor mixture.

In addition, while the cylindrical filter in its preferred embodiment is shown as having a circular cross-section, other cross-sectional shapes can also be used. Cross-sectional shapes such as an ellipse, a triangle, a rectangle, a square, or a polygonal shape of more than four sides, are also suitable.

Although the present invention has been described with reference to preferred embodiments, workers skilled in the art will recognize that changes may be made in form and detail without departing from the spirit and scope of the invention.

What is claimed is:

1. A gas filtration apparatus comprises a housing with an inlet for a gas to enter and an outlet for said gas to exit, the apparatus comprising:
    said housing containing a filter comprised of sintered metal fiber filter media having an active filtration area through which the gas flows to remove suspended particles from said gas;
    said filter media being substantially uniform in thickness and porosity throughout the active filtration area;
    said filter media being sealed to a metal structure in said housing by a metal seal rod having an arcuate length and configured to form an end seal around the filter by causing the filter to deform to form an end effective seal for filtration;
    said metal structure having an opening to permit gas to flow through.

2. The apparatus of claim 1 wherein said sintered fiber filter media being welded to the metal structure.

3. The apparatus of claim 1 wherein said sintered metal filter media being stainless steel.

4. The apparatus of claim 1 where
    said active filtration area being sufficient to produce a pressure drop of approximately 0.4 kPa or less when nitrogen gas at a temperature in a range of approximately 20 to 25° C. with an absolute pressure in a range of approximately 98 to 102 kPa flows through said active filtration area at a flow rate of approximately 3 standard liters per minute.

5. The apparatus of claim 1 wherein said sintered metal fiber filter being less than approximately 2.5 mm in thickness.

6. The apparatus of claim 1 wherein said filter comprises a sintered fiber filter having a porosity that is approximately 85% or less.

7. The apparatus of claim 1 wherein said sintered metal fiber filter media is tubular in shape having a maximum lateral width and a maximum longitudinal length.

8. The apparatus of claim 7 wherein said maximum lateral width being smaller than approximately 80 mm and said maximum longitudinal length being shorter than approximately 180 mm.

9. The apparatus of claim 7 wherein said maximum lateral width being smaller than approximately 40 mm.

10. The apparatus of claim 7 wherein said maximum longitudinal length being shorter than approximately 80 mm.

11. The apparatus of claim 7 wherein said sintered metal fiber filter media being round or polygonal in cross-section.

12. The apparatus of claim 1 including an additional sintered metal fiber filter media through which the gas flows to remove suspended particles from said gas.

13. A gas filtration apparatus comprises a housing with an inlet for a gas to enter and an outlet for said gas to exit, the apparatus comprising:
    said housing containing a filter comprised of sintered metal fiber filter media having an active filtration area through which the gas flows to remove suspended particles from said gas;
    said filter media being substantially uniform in thickness and porosity throughout the active filtration area;
    said filter media being sealed to a metal structure in said housing by compression seals formed in a longitudinal direction of and by metal rods pressing against the filter media and a metal internal support extending the length of the filter; and
    said metal structure having an opening to permit gas to flow through.

14. The apparatus of claim 13 wherein said sintered metal filter media being stainless steel.

15. The apparatus of claim 13 where said active filtration area is sufficient to produce a pressure drop of approximately 0.4 kPa or less when nitrogen gas at a temperature in a range of approximately 20 to 25° C. with an absolute pressure in a range of approximately 98 to 102 kPa flows through said active filtration area at a flow rate of approximately 3 standard liters per minute.

16. The apparatus of claim 13 wherein said sintered metal fiber filter being less than approximately 2.5 mm in thickness.

17. The apparatus of claim 13 wherein said filter comprises a sintered fiber filter having a porosity that is approximately 85% or less.

18. The apparatus of claim 1 wherein said sintered metal fiber filter media is tubular in shape having a maximum lateral width and a maximum longitudinal length.

19. The apparatus of claim 18 wherein said sintered metal fiber filter media being round or polygonal in cross-section.

20. The apparatus of claim 13 including an additional sintered metal fiber filter media through which the gas flows to remove suspended particles from said gas.

* * * * *